(12) United States Patent
de Raad (10) Patent No.: US 11,251,176 B2
(45) Date of Patent: Feb. 15, 2022

(54) APPARATUS FOR SUPPRESSING PARASITIC LEAKAGE FROM I/O-PINS TO SUBSTRATE IN FLOATING-RAIL ESD PROTECTION NETWORKS (71) Applicant: NXP B.V., Eindhoven (NL)

(72) Inventor: Gijs Jan de Raad, Bemmel (NL)

(73) Assignee: NXP B.V., Eindhoven (NL)

( * ) Notice: Subject to any disclaimer, the term of this patent is extended or adjusted under 35 U.S.C. 154(b) by 94 days.

(21) Appl. No.: 16/677,221

(22) Filed: Nov. 7, 2019

(65) Prior Publication Data
US 2021/0143146 A1 May 13, 2021

(51) Int. Cl.
H01L 27/00 (2006.01)
H01L 27/02 (2006.01)
H02H 9/04 (2006.01)

(52) U.S. Cl.
CPC ...... H01L 27/0277 (2013.01); H01L 27/0255 (2013.01); H01L 27/0292 (2013.01); H02H 9/046 (2013.01)

(58) Field of Classification Search
CPC ............... H01L 27/0277; H01L 27/025; H01L 27/0292; H02H 9/046
See application file for complete search history.

(56) References Cited

U.S. PATENT DOCUMENTS

| 6,671,153 | B1 | 12/2003 | Ker et al. |
| 6,724,603 | B2 | 4/2004 | Miller et al. |
| 7,098,511 | B2 | 8/2006 | Ker |
| 7,508,639 | B2 | 3/2009 | Wu et al. |
| 7,656,627 | B2 | 2/2010 | Ker |
| 7,889,470 | B2 | 2/2011 | Ker |
| 9,030,790 | B1 | 5/2015 | Tanase |
| 9,298,238 | B2 | 3/2016 | Mann et al. |
| 9,466,599 | B2 | 10/2016 | Nair |
| 2005/0174707 | A1 | 8/2005 | Ker |
| 2006/0092591 | A1 | 5/2006 | Yuan et al. |
| 2006/0092592 | A1 | 5/2006 | Yuan et al. |
| 2007/0058307 | A1 | 3/2007 | Mergens et al. |
| 2007/0091521 | A1 | 4/2007 | Hsueh |
| 2009/0021872 | A1 | 1/2009 | Ker |
| 2012/0002334 | A1 | 1/2012 | Kosonicky et al. |
| 2012/0154962 | A1 | 6/2012 | Russ et al. |
| 2014/0376135 | A1 | 12/2014 | Huo et al. |

(Continued)

FOREIGN PATENT DOCUMENTS

CN 101626154 1/2010

OTHER PUBLICATIONS

Notice of Allowance dated Apr. 28, 2020 in U.S. Appl. No. 15/390,037.

(Continued)

Primary Examiner — Adolf D Berhane
Assistant Examiner — Afework S Demisse (57) ABSTRACT An apparatus for suppressing parasitic leakage from I/O pins to substrate in floating rail based ESD protection networks is disclosed. In one embodiment, the apparatus includes an integrated circuit (IC) including a conductor, a pin, a first diode coupled between the pin and the conductor, and a first circuit coupled between the conductor and the pin. The first circuit is configured to selectively couple the pin to the conductor based on a voltage on the pin and a voltage on the conductor.

23 Claims, 5 Drawing Sheets (56) References Cited

U.S. PATENT DOCUMENTS

| | | |
|---|---|---|
| 2015/0194417 A1 | 7/2015 | Smith |
| 2015/0263505 A1 | 9/2015 | Takada |
| 2016/0218503 A1 | 7/2016 | La Rosa et al. |
| 2018/0183233 A1 | 6/2018 | De Raad et al. |
| 2018/0287376 A1* | 10/2018 | de Raad .............. H01L 27/0285 |

OTHER PUBLICATIONS

Leja, Ronald W., U.S. Patent and Trademark Office; Non-Final Office Action dated Dec. 31, 2018; U.S. Appl. No. 15/390,037; 21 pages.
Leja, Ronald W., U.S. Patent and Trademark Office; Final Office Action dated May 23, 2019; U.S. Appl. No. 15/390,037; 14 pages.
Leja, Ronald W., U.S. Patent and Trademark Office. Notice of Allowance dated Sep. 5, 2019; U.S. Appl. No. 15/390,037; 10 pages.
Notice of Allowance dated Jul. 30, 2020 in U.S. Appl. No. 15/390,037.

* cited by examiner

APPARATUS FOR SUPPRESSING PARASITIC LEAKAGE FROM I/O-PINS TO SUBSTRATE IN FLOATING-RAIL ESD PROTECTION NETWORKS

BACKGROUND

Electrostatic discharge (ESD) protection networks prevent damage to integrated circuits. Some ESD protection networks employ a rail clamp to provide a low impedance conduction path to ground during an ESD strike. The rail clamp may include a large field effect transistor (FET) that activates and shunts ESD current from a supply rail to a ground rail during the ESD strike.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
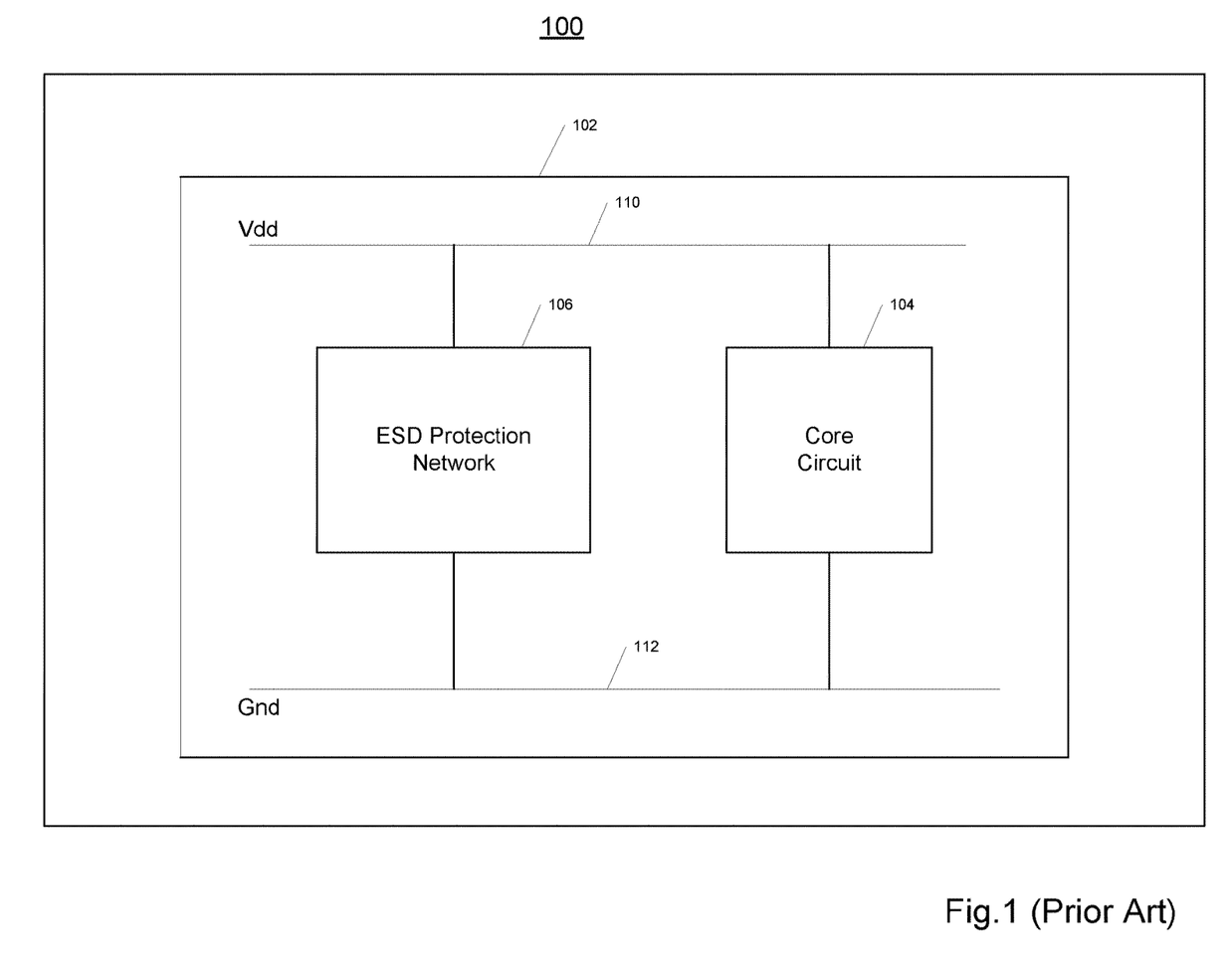
FIG. 1 is a block diagram of an example integrated circuit employing an ESD protection network.

FIG. 1 is a block diagram of a system 100 that includes an ESD protection network. System 100 can be used in various devices, especially mobile devices such as smartphones, tablet computers, laptop computers, etc., which are powered by rechargeable batteries. In the embodiment depicted in FIG. 1, system 100 includes an integrated circuit (IC) 102, which in turn includes a core circuit 104 and an ESD protection network 106 that protects the core circuit from ESD events. IC 102 can be embodied in a single semiconductor die. Although not shown, IC 102 may be in data communication with one or more additional ICs of system 100 via input pins, output pins, or input/output pins. During normal operation several pins are driven with signals that switch between high and low voltages (e.g., 5 V and 0 V). Unfortunately current may leak from these pins when they are driven to high voltages, which can be an issue for mobile devices that rely on batteries for power. The present disclosure describes an apparatus for reducing or eliminating this current leakage.

Core circuit 104 is protected from ESD events by ESD protection network 106. The core circuit typically includes one or more circuit components such as transistors and diodes that are susceptible to an ESD strike. Examples of the core circuit include, but are not limited to, central processing units, transceivers, switching circuits, etc. Core circuit 104 is coupled to supply rail 110 and ground rail 112. Supply rail 110 provides supply voltage Vdd (e.g., 5 V) to core circuit 104. Ground rail 112 provides ground GND (e.g. 0 V) to core circuit 104. Although IC 102 is shown as including the core circuit and the ESD protection network, in other embodiments, the IC device may include additional circuit elements such as drivers that drive I/O pins.

ESD protection network 106 is connected between supply rail 110 and ground rail 112. In the embodiment depicted in FIG. 1, the ESD protection network may include a rail clamp, which is configured to shunt ESD current from supply rail 110 to ground rail 112 to protect IC device 100, including core circuit 104, from overvoltage during an ESD event. As more fully described below, ESD protection network 106 may also include serially connected ESD diodes that are coupled in parallel with core circuit 104.

Figure 2:
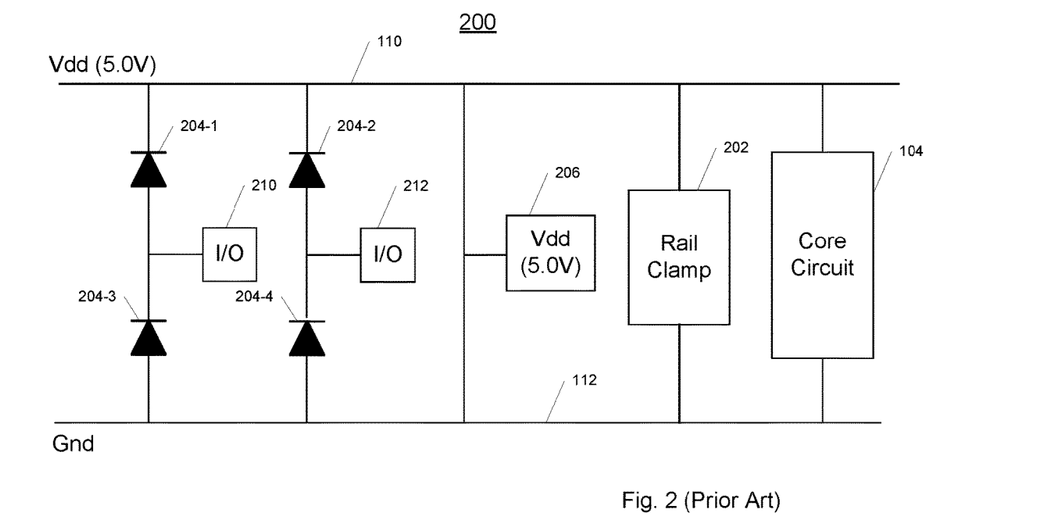
FIG. 2 is a schematic diagram illustrating an example of a conventional rail-based ESD protection network that can be employed in FIG. 1.

FIG. 2 depicts an example embodiment of a conventional rail-based ESD protection network 200 that can be used in FIG. 1. ESD protection network 200 includes rail clamp 202 and ESD diodes 204 that are located between supply rail 110 and ground rail 112. As shown in FIG. 2, the circuit includes a Vdd pin 206, and two I/O pins 210 and 212. In the example of FIG. 2, each I/O pin is connected between two serially connected ESD diodes 204, which in turn are coupled between the supply and ground rails. In general, a diode contains a p-n junction, which is a boundary or interface between two types of semiconductor materials, p-type and n-type. The "p" (positive) side contains an excess of holes, while the "n" (negative) side contains an excess of electrons in the outer shells of the electrically neutral atoms there. The arrangement allows electrical current to pass through the junction only in one direction. The p-n junction is created by doping, for example by ion implantation, diffusion of dopant, or by epitaxy (growing a layer of crystal doped with one type of dopant on top of a layer of crystal doped with another type of dopant). Doping can range from light to heavy. Heavy doping is often indicated by n+ for n-type or p+ for p-type. ESD diodes 204 can be formed as p+ "pockets or contacts" in or on n-wells as is known in the field of ESD protection networks.

Figure 3:
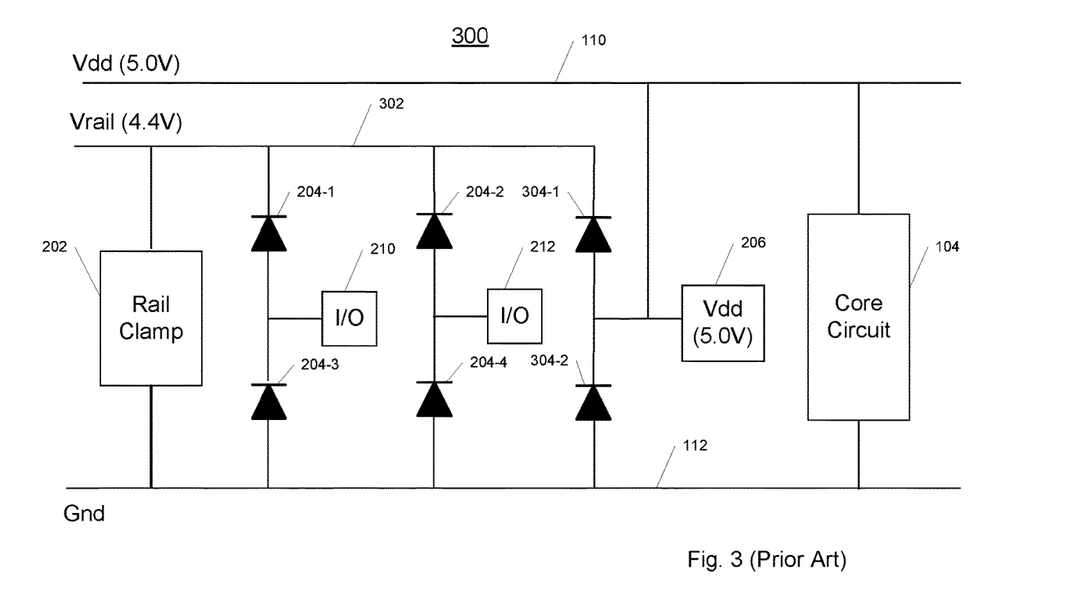
FIG. 3 is a schematic diagram illustrating an example of a floating rail-based ESD protection network that can be employed in FIG. 1.

A floating rail-based ESD protection network is an alternative to conventional rail-based ESD protection networks. FIG. 3 depicts an example floating rail-based ESD protection network 300 that can be employed in the IC 100 of FIG. 1. ESD protection network 300 includes a floating ESD rail 302, which is located between supply rail 110 and ground rail 112 and coupled so that the floating ESD rail 302 is not biased to Vdd. As shown, the floating ESD rail 302 is coupled to supply rail 110 via ESD diodes 304-1. One advantage of this design is when IC 102 is switched off, signals received at one of the I/O pins 210 or 212 from other ICs in system 100 cannot (partially) power IC 102. However, a drawback of the floating ESD rail-based design relates to unique electrical biasing that can exist during normal IC operation, combined with the way the ESD diodes are typically constructed. The combination of the unique electrical biasing and the typical ESD diode structure can lead to an increased, and unwanted, current leakage at the I/O pins and/or at the Vdd pin. The current leakage is unwanted particularly in mobile devices that rely on a battery for power.

In both ESD protection networks 200 and 300, the supply rail 110 is held at its operating voltage (e.g., 5 V). The I/O-pins are driven to 0 V or 5 V by a signal driver of IC 102 or by a signal driver of another IC in system 100. The simplest driver consists of an inverter with transistors that are sized to supply enough current (i.e., must have enough driving capability) to achieve satisfactory signal rise and fall times for a given capacitive load. In the conventional rail-based ESD protection network 200 the upper ESD diodes 204-1 and 204-2 are not forward biased when the I/O pin is driven to 5 V. But they will be forward biased by an ESD strike. In the floating ESD rail-based protection network 300, on the other hand, the ESD rail 302 is coupled to the supply rail via diode 304-1. This means that with the supply rail 110 biased at Vdd=5.0 V, the ESD rail 302 may be biased at 4.4 V, assuming a 0.6 V threshold drop across diode 304-1. Due to the structure of the ESD diodes as more fully described below, when I/O pin 210 or 212 is driven to 5.0 V while the ESD rail 302 is biased at 4.4 V while, current may leak from the I/O pin to ground line 110.

Figure 4:
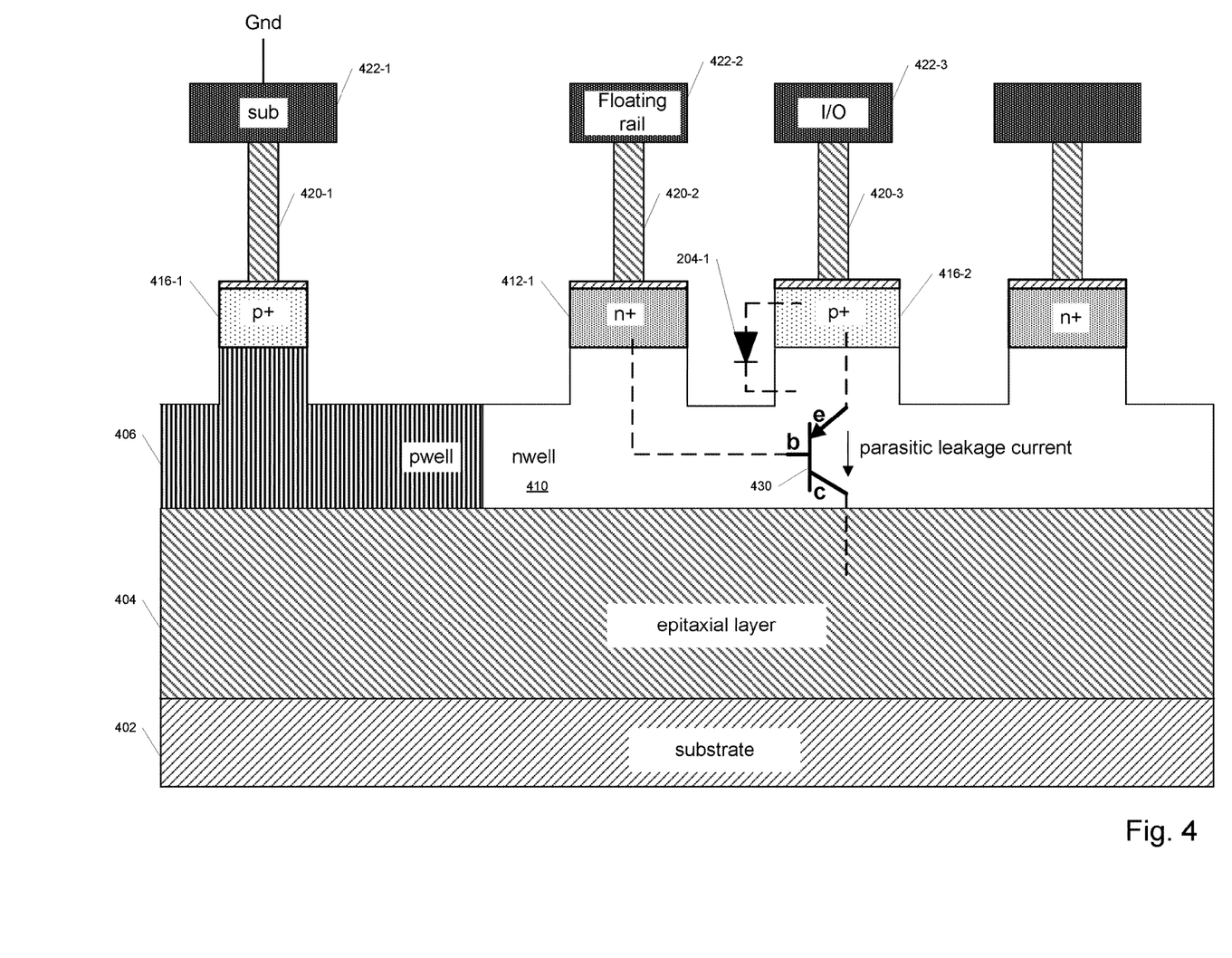
FIG. 4 is a cross-sectional view of a semiconductor die that contains relevant components of the floating rail-based ESD protection network of FIG. 3.

ESD diodes between the I/O pins and floating ESD rail 302 typically consist of a p+ contact formed on or in an n-well. FIG. 4 is a cross-sectional view of a semiconductor die that includes relevant components of the floating rail-based ESD protection network 300. In particular, FIG. 4 depicts a p-type substrate layer 402, a p-type epitaxial layer 404, a p-well region 406, an n-well region 410, n+ contacts 412, p+ contacts 416, etc. FIG. 4 also shows conductors 420 coupled between respective n+ and p+ contacts and conductive layers 422, which in turn are coupled directly or indirectly to the floating ESD rail 302 and I/O pin 210 as shown. An oxide layer normally shown in these types of cross-sectional views, is not provided so that its lack of presence aids in the understanding of FIG. 4. The p-type substrate layer 402, p-type epitaxial layer 404, p-well region 406, and p+ contact 416-1 are biased to ground via sub layer 422-1. The conducting regions 420 and 422, the semiconducting regions 416 and 412, and parts of the p-well region 406 and n-well region 410, are encased in non-conductive material (not shown) like Silicon Oxide, Silicon Nitride, or combinations thereof.

The p-n junction between p+ contact 416-2 and nwell 410 forms ESD diode 204-1, which is represented schematically in FIG. 4. The p-n junction in combination with the junction between n-well 410 and p-type epitaxial layer 404 forms a parasitic pnp bipolar junction transistor, which is represented schematically as pnp bipolar transistor 430. As shown, the pnp bipolar transistor 430 includes an emitter e that is biased by the voltage (e.g., 5.0 V) on I/O pin 210 via conductive layer 422-3, a base b that is biased by the voltage (e.g., 4.4V) on the floating ESD rail 302 via conductive layer 422-2, and a collector c that is biased to ground via the p-type epitaxial layer 404. A pnp transistor is "on" when its base is pulled low relative to the emitter. When I/O pin 210, and thus emitter e, is biased to 5.0 V, pnp bipolar transistor 430 will be biased in active forward mode (e.g., "on") since the ESD floating rail 302, and thus base b, is biased to 4.4 V, and ground rail 112, and thus collector C, is biased to ground. In the active forward mode, pnp bipolar transistor 430 transmits leakage current from I/O pin 210 to ground. It should be noted that the leakage current from the I/O pins to ground can substantially exceed the leakage current through rail clamp 202 in FIG. 3.

The leakage current shown in FIG. 4 can be substantially reduced or eliminated if the bipolar transistor 430 is maintained in the inactive state. More particularly, the leakage current shown can be substantially reduced or eliminated if the floating ESD rail 112, and thus base b, is biased to a voltage that is substantially equal to or greater than the voltage on the I/O pin 210. The present disclosure describes bias breaking circuits (BBCs) that can be added to the floating ESD rail-based protection network 300 to ensure that parasitic bipolar pnp junction transistors, like the bipolar pnp junction transistor schematically shown in FIG. 4, will remain inactive.

Figure 5A:
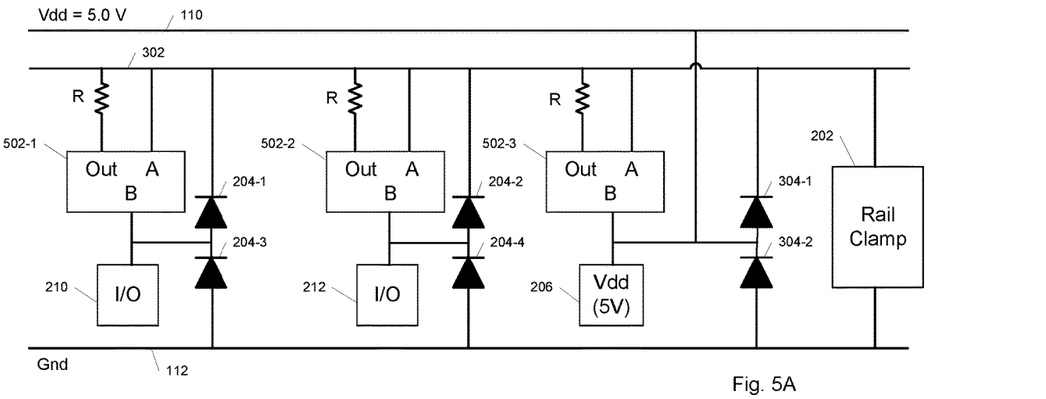
FIGS. 5A-5C are schematic diagrams of floating rail-based ESD protection networks employing bias breaking circuits that can be employed in FIG. 1.

FIG. 5A is a schematic diagram of the floating ESD rail-based protection network 300 with BBCs 500 added thereto according to one embodiment. Each of the BBCs includes a pair of inputs A and B, and an output Out. Each input A is coupled to the floating ESD rail 302. Each input B is coupled to a respective pin. It should be understood that although two I/O pins are shown in FIG. 5A and other Figures herein, there could be only one I/O pin with corresponding ESD diodes or there could be more than two I/O pins with corresponding ESD diodes depending on the implementation. Each output Out is coupled to the floating point ESD rail 302 via a resistor R. BBC can selectively couple input A or B to output Out based upon the voltages at inputs A and B. In one embodiment BBC 500 effectively compares the voltage on the ESD rail 302 with the voltage on its respective pin. If the voltage on the pin (input B) is higher than the voltage on the ESD rail 302 (input A), the BBC will connect input B to the floating rail 302 via resistor R, and if the voltage on the pin is lower than the voltage on the ESD rail 302, the BBC will connect input A to ESD rail 302 via resistor R. As result, floating point ESD rail 302 should be driven to the highest of the voltages at the I/O and Vdd pins. Since the floating point ESD rail 302 is maintained at the highest of the voltages, the parasitic pnp bipolar transistors (e.g., transistor 430 in FIG. 4) coupled to the pins should remain inactive. In other words, with continuing reference to FIG. 4, the floating rail 302 biases the base b of bipolar transistor 430 to a voltage that is substantially equal to or greater than the voltage at emitter e, which places transistor 430 in an inactive state. While in the inactive state, transistor 430 does not leak current to ground.

Figure 6A:
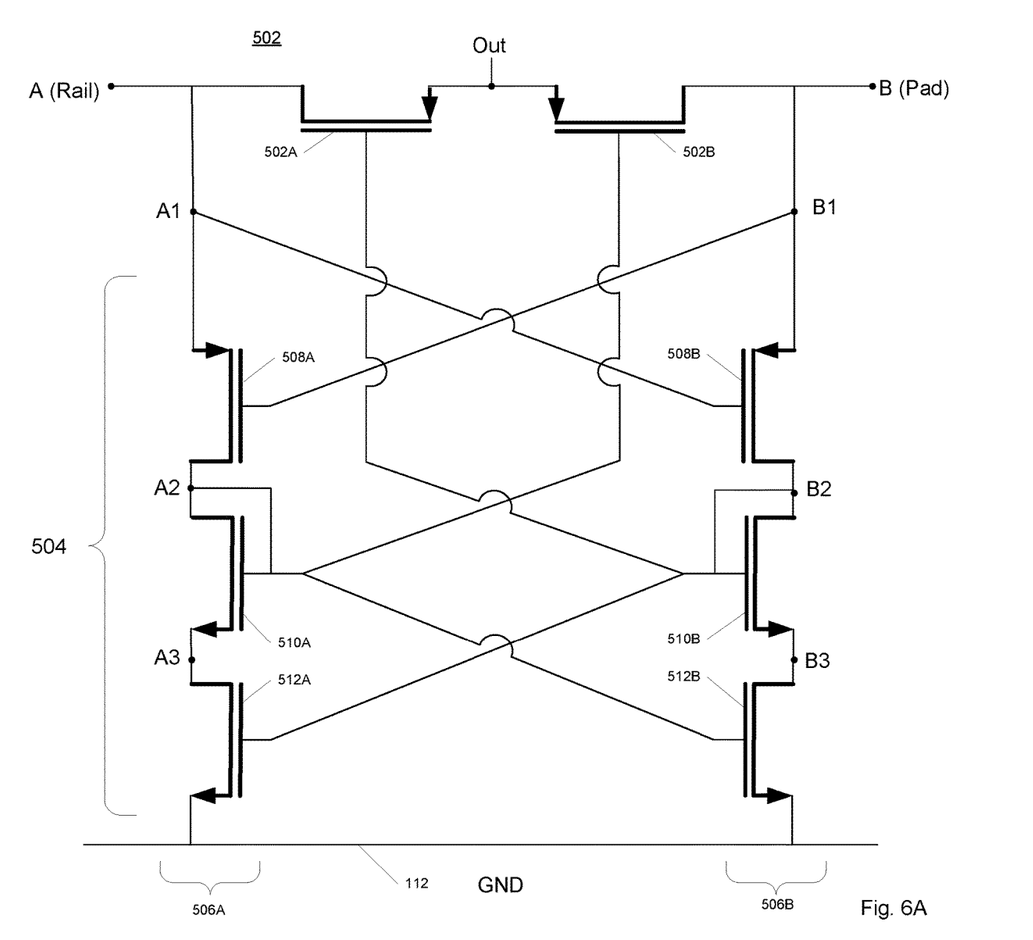
FIGS. 6A and 6B are schematic diagrams of alternative bias breaking circuits that can be employed in the floating rail-based ESD protection networks of FIGS. 5A-5C.

With continuing reference to FIGS. 3 and 5, FIG. 6A illustrates one embodiment of the BBC 500. As shown BBC 500 includes a pair of switches 502A and 502B and a control circuit 504. Switches 502A and 502B are coupled in series between input A (rail 302) and input B (pin). In the embodiment shown in FIG. 6A, switches 502A and 502B take form in p-channel metal oxide semiconductor FETs (PMOSFETs). PMOSFETs 502A and 502B selectively couple inputs A and B to output Out based on control signals from control circuit 504, and control circuit 504 generates the control signals based upon the voltages at inputs A and B. In the embodiment shown, control circuit 504 effectively operates to compare the voltages at inputs A (rail 302) and B (pin). If the voltage at input B (pin) is higher than the voltage at input A (rail 302), the control circuit 504 will activate PMOSFET 502B to connect input B to output Out, while deactivating PMOSFET 502A, and if the voltage at input B (pin) is lower than the voltage at input A (ESD rail 302), the control circuit 504 will activate PMOSFET 502A to connect input A to output Out, while deactivating PMOSFET 502B.

Control circuit 504 includes a pair of latching circuits 506A and 506B. The gate of PMOSFET 502A is controlled by a latching circuit 506B, while a gate of PMOSFET 502B is controlled by a latching circuit 506A. Latching circuit 506A includes PMOSFET 508A, and a pair of n-channel MOSFETs (NMOSFETs) 510A and 512A, the combination of which is connected in series as shown between input A and the ground rail 110. Latching circuit 506B includes PMOSFET 508B, and a pair NMOSFETs 510B and 512B, the combination of which is connected in series as shown between input B and ground rail 110.

The sources of PMOSFETs 508A and 508B are coupled to inputs A and B respectively. The gates of PMOSFETs 508A and 508B are coupled to inputs B and A, respectively. When the voltage at input A is a threshold higher than that at input B, PMOSFET 508A will activate to the conductive state while PMOSFET 508B is forced into a non-conductive, inactive state. This raises the voltage at node A2 until it equals the voltage at input A1, which, in turn, forces NMOSFET 512B into the active state, so that its drain (node B3) is driven to ground. The drain of NMOSFET 510B (node B2), which is connected in series with NMOSFET 512B, is pulled down to about one threshold voltage above ground. This puts NMOSFET 512A into an all but non-conductive state. Since the low voltage on node B2 is also applied to the gate of PMOSFET 502A, PMOSFET 502A is activated so that the voltage of input A (which is the highest of A and B) is transferred to Out.

If the voltage at input B (pin) is raised in such a way that it exceeds the voltage of input A (ESD rail) by more than the threshold voltage of the PMOSFET type used, then the voltage on input B is transferred to Out. This process happens as described in the previous paragraph, but with the roles of PMOSFET 502A, PMOSFET 508A, NMOSFET 510A, and NMOSFET 512A interchanged with the roles of PMOSFET 502B, PMOSFET 508B, NMOSFET 510B, and NMOSFET 512B, respectively, and the roles of nodes A1, A2, A3, interchanged with those of B1, B2, and B3, respectively.

When the voltage at input B (pin) rises and exceeds the voltage of input A (ESD rail) by less than a threshold voltage of the PMOSFET type, PMOSFET 508A will deactivate and PMOSFET 508B will activate. The current conducted by activated PMOSFET 508B, however small, has the effect of filling the gate capacitances of PMOSFET 502A and NMOSFET 512A until node B2 assumes the voltage of input B itself. This puts NMOSFET 512A into the active, conductive state, forcing A3 to ground, which in turns forces node A2 to a voltage that is a threshold above ground. The voltage on node A2 is transferred to the gate of PMOSFET 502B, which puts PMOSFET 502B into the active, conductive state, thereby coupling input B to Out.

Figure 5B:
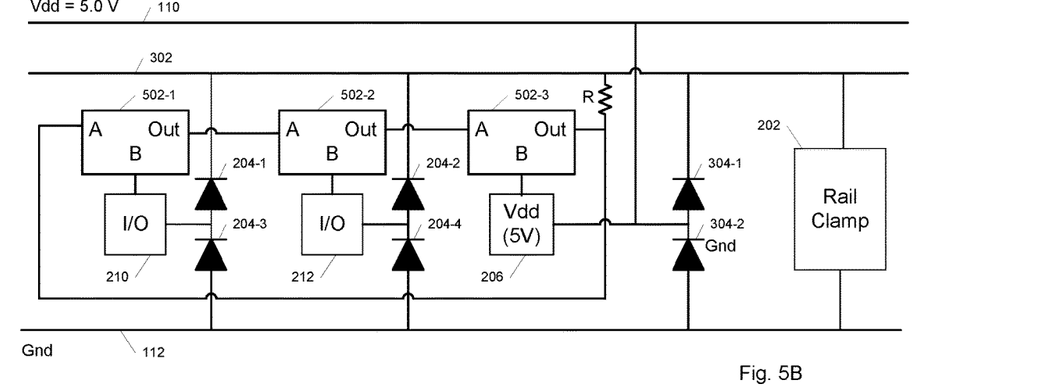
Figure 5C:
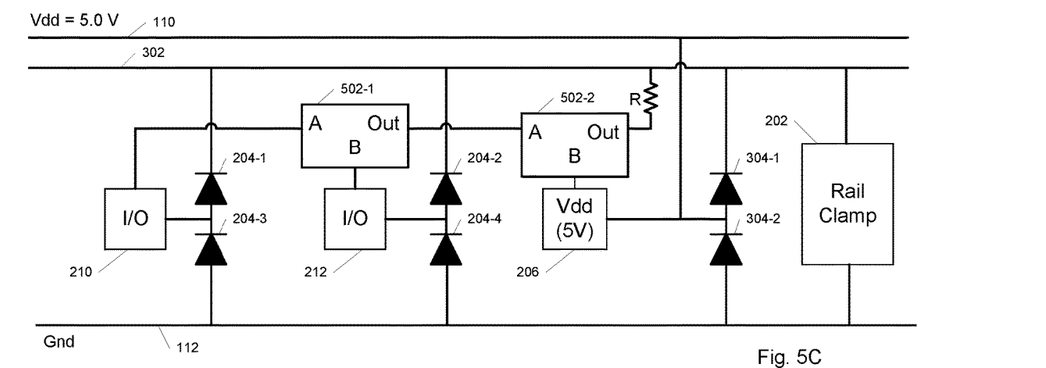

FIG. 5A illustrates one embodiment of the ESD protection network 300 with BBCs 502 added thereto. FIGS. 5B and 5C illustrate alternative embodiments of ESD protection network 300 with BBCs 502 added thereto. FIG. 5B illustrates BBC circuits 502 coupled in a ring. As shown in FIG. 5B the output Out and input A of consecutive BBCs 502 in the ring are coupled together. For example the output Out of the last BBC circuit 502-3 is coupled to input A of the first BBC 502-1. In addition, output Out of BBC 502-3 is coupled to floating rail 302 via resistor R. In this configuration, the highest voltage on pins 206, 210, and 212, is selected and forwarded to the output Out of BBC 502-3. FIG. 5C illustrates BP circuits coupled in series as shown. In this configuration the output Out is coupled to the input A of consecutive BBC's 502 in the series. Output Out of the last BBC 502-2 in the series is coupled to the floating rail 302 via resistor R. Like the configuration shown in FIG. 5B, the highest voltage on the pins 206, 210, and 212, in FIG. 5C is selected and forwarded to the output Out of BBC 502-3. Between the embodiments shown in FIGS. 5A-5C, the embodiment shown in FIG. 5A may be preferable.

Figure 6B:
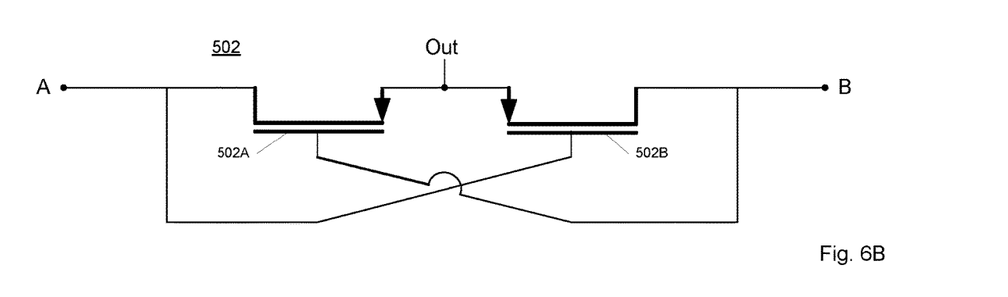

FIG. 6A illustrates one embodiment of BBC 502. FIG. 6B illustrates an alternative embodiment of BBC 502. Like the BBC shown in FIG. 6A, the BBC shown in FIG. 6B includes PMOSFET switches 502A and 502B coupled in series as shown between inputs A and B. Unlike the BBC shown in FIG. 6A, the gate of PMOSFETB 502 is controlled by the voltage at input B, and the gate of PMOSFET 502B is controlled by the voltage at input A. If the voltage at input A is a threshold below the voltage at input B, PMOSFET 508B will be activated, and Out is driven to the voltage at input B, while PMOSFET 508A will be deactivated. If the voltage at input B is a threshold below the voltage at input A, PMOSFET 508A will be activated, and Out is driven to the voltage at input A, while PMOSFET 508B will be deactivated. Between the embodiments shown in FIGS. 6A and 6B, the embodiment of FIG. 6A may be preferable due to biasing of the gates of PMOSFETs 502A and 502B. The gate bias on PMOSFET 502B in FIG. 6B is the difference between voltages on inputs B and A, which can be as low as half a threshold voltage in some situations. In contrast, the control circuit 504 of FIG. 6A converts any voltage difference between inputs A and node B into a gate bias for PMOSFET 502A or PMOSFET 502B that is equal to the highest voltages at input A or B, minus one threshold voltage. As a result, a strong bias is applied to the gates of PMOSFET 502A or PMOSFET 502B also when the voltages at inputs A and B differ by less than one threshold voltage.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An apparatus comprising:
   an integrated circuit (IC) comprising:
      a conductor;
      a pin;
      a first diode coupled between the pin and the conductor;
      a first circuit coupled between the conductor and the pin and configured to selectively couple the pin to the conductor based on a voltage on the pin and a voltage on the conductor;
   wherein the first circuit comprises:
      first and second inputs coupled to the conductor and the pin, respectively;
      a first output coupled to the conductor via a first resistor;
      first and second switches coupled in series between the first and second inputs;
      wherein the first switch couples the first input to the first output only when the conductor voltage exceeds the pin voltage, and;
      wherein the second switch couples the second input to the first output only when the pin voltage exceeds the conductor voltage.

2. The apparatus of claim 1 wherein the pin comprises a voltage input pin for receiving a supply voltage to power the IC, and wherein the first circuit couples the voltage input pin to the conductor only when the supply voltage exceeds the conductor voltage.

3. The apparatus of claim 2 wherein the IC further comprises:
   a first input/output (I/O) pin;
   a second diode coupled between the first I/O pin and the conductor;
   a second circuit coupled between the first I/O pin the conductor, wherein the second circuit couples the first I/O pin to the conductor only when a voltage on the first I/O pin exceeds the conductor voltage.

4. The apparatus of claim 3 wherein the integrated circuit comprises a p-type region formed on or in an n-type region to create the second diode, wherein the p-type region is coupled to the first I/O pin, and wherein the n-type region is coupled to the conductor.

5. The apparatus of claim 4 wherein the IC further comprises a p-type layer, wherein the n-type region is formed on the p-type layer to create an n-p junction of a parasitic bipolar transistor, wherein the p-type layer is coupled to a ground line, wherein the parasitic bipolar transistor conducts current from the first I/O pin to the ground line if the conductor voltage is less than the first I/O pin voltage.

6. The apparatus of claim 5 wherein the IC further comprises a p-type substrate, wherein the p-type layer is formed on the p-type substrate, wherein the p-type substrate is coupled to the ground line.

7. The apparatus of claim 6 wherein the p-type region comprises a p+ pocket, wherein the n-type region comprises an n-well, and wherein the p-type layer comprises a p-type epitaxial layer.

8. The apparatus of claim 3 further comprising a driver circuit for driving the first I/O pin.

9. The apparatus of claim 1:
wherein the first and second switches take form in first and second field effect transistors (FETs), respectively;
wherein the first circuit further comprises:
first and second latching circuits configured to drive second and first gates, respectively, of the second and first FETs, respectively, based on the pin and the conductor voltages;
wherein the first latching circuit drives the second gate with an activation voltage when the pin voltage exceeds the conductor voltage, wherein the first latching circuit drives the second gate with a deactivation voltage when the conductor voltage exceeds the pin voltage;
wherein the second FET activates when the second gate is driven with the activation voltage, and wherein the second FET deactivates when the second gate is driven with the deactivation voltage;
wherein the second latching circuit drives the first gate with the activation voltage when the conductor voltage exceeds the pin voltage, wherein the second latching circuit drives the first gate with the deactivation voltage when the pin voltage exceeds the conductor voltage;
wherein the second FET activates when the second gate is driven with the activation voltage, and wherein the second FET deactivates when the second gate is driven with the deactivation voltage.

10. The apparatus of claim 9:
wherein each of the first and second FETs take form in a p-channel FET;
wherein sources of the first and second FETs are coupled together and to the first output;
wherein the activation voltage is lower than the deactivation voltage.

11. The apparatus of claim 10:
wherein the first latching circuit is coupled between the conductor and a ground line;
wherein the second latching circuit is coupled between the pin and the ground line.

12. An apparatus comprising:
an integrated circuit (IC) comprising:
a conductor;
a pin;
a first diode coupled between the pin and the conductor;
a first circuit coupled between the conductor and the pin and configured to selectively couple the pin to the conductor based on a voltage on the pin and a voltage on the conductor;
wherein the pin comprises a voltage input pin for receiving a supply voltage to power the IC, and wherein the first circuit couples the voltage input pin to the conductor only when the supply voltage exceeds the conductor voltage;
wherein the first circuit comprises:
first and second inputs coupled to the conductor and the voltage input pin, respectively;
a first output coupled to the conductor via a first resistor;
first and second switches coupled in series between the first and second inputs;
wherein the first switch couples the first input to the first output only when the conductor voltage exceeds the supply voltage, and;
wherein the second switch couples the second input to the first output only when the supply voltage exceeds the conductor voltage.

13. The apparatus of claim 12:
wherein the first and second switches take form in first and second field effect transistors (FETs), respectively;
wherein the first circuit further comprises:
first and second latching circuits configured to drive second and first gates, respectively, of the second and first FETs, respectively, based on the supply and the conductor voltages;
wherein the first latching circuit drives the second gate with an activation voltage when the supply voltage exceeds the conductor voltage, wherein the first latching circuit drives the second gate with a deactivation voltage when the conductor voltage exceeds the supply voltage;
wherein the second FET activates when the second gate is driven with the activation voltage, and wherein the second FET deactivates when the second gate is driven with the deactivation voltage;
wherein the second latching circuit drives the first gate with the activation voltage when the conductor voltage exceeds the supply voltage, wherein the second latching circuit drives the first gate with the deactivation voltage when the supply voltage exceeds the conductor voltage;
wherein the second FET activates when the second gate is driven with the activation voltage, and wherein the second FET deactivates when the second gate is driven with the deactivation voltage.

14. The apparatus of claim 13:
wherein each of the first and second FETs take form in a p-channel FET;
wherein sources of the first and second FETs are coupled together and to the first output;
wherein the activation voltage is lower than the deactivation voltage.

15. The apparatus of claim 14:
wherein the first latching circuit is coupled between the conductor and a ground line;
wherein the second latching circuit is coupled between the voltage input pin and the ground line.

16. The apparatus of claim 15 wherein the first latching circuit comprises:
a third FET, wherein the third FET takes form in a p-channel FET;

a fourth FET, wherein the fourth FET takes form in an n-channel FET;
a fifth FET, wherein the fifth FET takes form in an n-channel FET;
wherein the third, fourth, and fifth FETs are coupled in series between the conductor and the ground line with the fourth FET coupled between the third and fifth FETs;
wherein a source and a gate of the third FET are coupled to the conductor and voltage input pin, respectively;
wherein drains of the third and fourth FETs, the gate of the fourth FET, and the gate of the second FET are coupled together;
wherein the source and drain of the fourth and fifth FETs are coupled together;
wherein a gate and a source of the fifth FET are coupled to the ground line and the gate of the first FET, respectively.

17. An apparatus comprising:
an integrated circuit (IC) comprising:
a conductor;
a pin;
a first diode coupled between the pin and the conductor;
a first circuit coupled between the conductor and the pin and configured to selectively couple the pin to the conductor based on a voltage on the pin and a voltage on the conductor;
wherein the pin comprises a voltage input pin for receiving a supply voltage to power the IC, and wherein the first circuit couples the voltage input pin to the conductor only when the supply voltage exceeds the conductor voltage;
wherein the IC further comprises:
a first input/output (I/O) pin;
a second diode coupled between the first I/O pin and the conductor;
a second circuit coupled between the first I/O pin the conductor, wherein the second circuit couples the first I/O pin to the conductor only when a voltage on the first I/O pin exceeds the conductor voltage;
wherein the second circuit comprises:
third and fourth inputs coupled to the conductor and the I/O pin, respectively;
a second output coupled to the conductor via a second resistor;
third and fourth switches coupled in series between the third and fourth inputs;
wherein the third switch is configured to couple the third input to the second output only when the conductor voltage exceeds the I/O pin voltage, and;
wherein the fourth switch is configured to couple the fourth input to the second output only when the I/O pin voltage exceeds the conductor voltage.

18. The apparatus of claim 17:
wherein the third and fourth switches take form in third and fourth field effect transistors (FETs), respectively;
wherein the second circuit further comprises:
third and fourth latching circuits configured to drive fourth and third gates, respectively, of the fourth and third FETs, respectively, based on the voltages on the pin and the conductor;
wherein the third latching circuit drives the fourth gate with the activation voltage when the I/O pin voltage exceeds the conductor voltage, wherein the third latching circuit drives the fourth gate with the deactivation voltage when the conductor voltage exceeds the I/O pin voltage;

wherein the fourth FET activates when the fourth gate is driven with the activation voltage, and wherein the fourth FET deactivates when the fourth gate is driven with the deactivation voltage;
wherein the fourth latching circuit drives the third gate with the activation voltage when the conductor voltage exceeds the I/O pin voltage, wherein the fourth latching circuit drives the third gate with the deactivation voltage when the I/O pin voltage exceeds the conductor voltage;
wherein the fourth FET activates when the fourth gate is driven with the activation voltage, and wherein the fourth FET deactivates when the fourth gate is driven with the deactivation voltage.

19. An apparatus comprising:
an integrated circuit (IC) comprising, which in turn comprises:
N pins;
a first conductor to supply voltage to components of the IC;
a second conductor;
N diodes each of which is coupled between a respective one of the N pins and the second conductor;
N circuits each comprising first and second inputs, and an output;
wherein a second input of each of the N circuits is coupled to a respective one of the N pins;
wherein the N circuits are coupled in a ring, wherein a first input of a first circuit in the ring is coupled to an output of an Nth circuit in the ring;
wherein the output of the Nth circuit is coupled to the second conductor;
wherein each of the N circuits is configured to selectively couple its second input to its output based on a voltage at its second input and a voltage at its first input.

20. The apparatus of claim 19 wherein each of the N diodes comprise a p-n junction between a p+ pocket and an n-well, wherein the n-well is formed in or on a p-type layer.

21. An apparatus comprising:
an integrated circuit (IC) comprising, which in turn comprises:
N+1 pins;
a floating rail conductor;
a supply conductor configured to supply voltage to components of the IC;
N+1 diodes coupled between the floating rail conductor and the N+1 pins, respectively;
N circuits, each comprising first and second inputs, and an output;
wherein the N circuits are coupled in series;
wherein first and second inputs of a first circuit in the series are coupled to first and second pins, respectively, of the N+1 pins;
wherein an output of an Nth circuit in the series is coupled to the floating rail conductor;
wherein each of the N circuits is configured to selectively couple its second input to its output based on a voltage at its second input and a voltage at its first input.

22. The apparatus of claim 21 further comprising a driver coupled to at least one of the N+1 pins and configured to drive the at least one of the N+1 pins to a voltage that is substantially equal to the supply voltage.

23. The apparatus of claim 21 wherein each of the N+1 diodes comprises a p-n junction between a p+ pocket formed and an n-well, wherein the n-well is formed in or on a p-type layer.

\* \* \* \* \*